(12) United States Patent
Pettit

(10) Patent No.: US 9,755,660 B2
(45) Date of Patent: Sep. 5, 2017

(54) APPARATUS FOR GENERATING DIGITAL THERMOMETER CODES

(71) Applicant: Ricky L. Pettit, Austin, TX (US)

(72) Inventor: Ricky L. Pettit, Austin, TX (US)

(73) Assignee: Intel Corporation, Santa Clara, CA (US)

(*) Notice: Subject to any disclaimer, the term of this patent is extended or adjusted under 35 U.S.C. 154(b) by 573 days.

(21) Appl. No.: 13/769,167

(22) Filed: Feb. 15, 2013

(65) Prior Publication Data

US 2014/0232583 A1    Aug. 21, 2014

(51) Int. Cl.
*G08C 19/12* (2006.01)
*H03M 7/16* (2006.01)

(52) U.S. Cl.
CPC .................. *H03M 7/165* (2013.01)

(58) Field of Classification Search
CPC ..................................... H03M 7/165
USPC ................................. 341/187, 184
See application file for complete search history.

(56) References Cited

U.S. PATENT DOCUMENTS

| 5,563,540 | A | 10/1996 | Ashley et al. |
| 7,375,552 | B1* | 5/2008 | Young ............. H03K 19/17728 326/37 |
| 8,436,642 | B1 | 5/2013 | Kireev et al. |
| 8,823,561 | B1* | 9/2014 | Hammer et al. ............... 341/67 |
| 2003/0037190 | A1* | 2/2003 | Alexander et al. ............ 710/52 |
| 2004/0117694 | A1* | 6/2004 | Howlett ........................ 714/710 |
| 2005/0114567 | A1* | 5/2005 | Lambrache et al. ........... 710/52 |
| 2005/0127939 | A1* | 6/2005 | Allen et al. .................... 326/30 |
| 2005/0134307 | A1* | 6/2005 | Stojanovic et al. ........... 326/31 |
| 2005/0232010 | A1 | 10/2005 | Cernea |
| 2006/0028262 | A1 | 2/2006 | Grimone, III et al. |
| 2006/0091932 | A1 | 5/2006 | Farjad-Rad et al. |
| 2009/0116307 | A1 | 5/2009 | Cottier et al. |
| 2009/0315624 | A1 | 12/2009 | Chow et al. |
| 2010/0095177 | A1* | 4/2010 | Forlenza ......... G01R 31/31854 714/731 |
| 2011/0075491 | A1 | 3/2011 | Yun et al. |
| 2013/0057320 | A1 | 3/2013 | Liu et al. |
| 2014/0159769 | A1* | 6/2014 | Hong et al. .................... 326/30 |

OTHER PUBLICATIONS

Notification of Transmittal of the International Search Report and the Written Opinion of the International Searching Authority issued for International Patent Application No. PCT/US2012/071714, mailed Sep. 12, 2013.

Garcia, Jose C., et al., "High Performance Bootstrapped CMOS Low to High-Swing Level-Converter for On-Chip Interconnects," *18th European Conference on Circuit Theory and Design*, pp. 795-798, 2007.

(Continued)

*Primary Examiner* — Amine Benlagsir
(74) *Attorney, Agent, or Firm* — Blakely, Sokoloff, Taylor & Zafman LLP

(57) ABSTRACT

Described is an apparatus for generating a thermometer code, the apparatus comprises: a 2-bit bi-directional shift register; and more than two multiplexers operable to form storage units and coupled together in a chain to generate the thermometer code, the more than two multiplexers controlled by outputs of the 2-bit bi-directional shift register.

17 Claims, 13 Drawing Sheets

(56) References Cited

OTHER PUBLICATIONS

Shrivastava, Aatmesh, et al., "A Charge Pump Based Receiver Circuit for Voltage Scaled Interconnect," *International Symposium on Low Power Electronics and Design*, pp. 327-332, 2012.

Zhang, Hui, et al., "Low-Swing On-Chip Signaling Techniques: Effectiveness and Robustness," *IEEE Transactions on Very Large Scale Integration (VLSI) Systems*, vol. 8, No. 3, pp. 264-272, Jun. 2000.

\* cited by examiner

| Table: 1
Thermometer Code |
|---|
| 00000000 |
| 10000000 |
| 11000000 |
| 11100000 |
| 11110000 |
| 11111000 |
| 11111100 |
| 11111110 |
| 11111111 |

| Table: 2
Pseudo-Thermometer Code |
|---|
| 00000000 |
| 10000000 |
| 11000000 |
| 11100000 |
| 11110000 |
| 11111000 |
| 11111100 |
| 11111110 |
| 11111111 |
| 01111111 |
| 00111111 |
| 00011111 |
| 00001111 |
| 00000111 |
| 00000011 |
| 00000001 |
| 00000000 |

Fig. 5B

APPARATUS FOR GENERATING DIGITAL THERMOMETER CODES

BACKGROUND

Thermometer codes are generally useful for realizing monotonic signal control. Traditional thermometer code is implemented with an N-bit shift register storing continuous patterns of ones and zeros, where 'N' is an integer greater than two. However, traditional thermometer code implemented as by the N-bit shift register requires a sequential unit (e.g., a flip-flop) per bit and associated logic to control the sequential unit. For large thermometer codes, e.g., N=64, traditional thermometer code implemented as the N-bit shift register negatively impacts silicon area, power consumption, and clock load i.e., it results in larger silicon areas, consumes high power, and puts excessive loads on clock distribution network requiring more clock buffers.

An alternative traditional thermometer code generator uses a bi-directional grey-code counter with a state decoder. This approach reduces the number of flip-flops required, lending this technique to larger code lengths. However, the grey-code approach is more complex to design and modify because arbitrary code lengths each require a unique design with increased complexity. For example, a three flip-flop counter based design could only generate a maximum seven-bit code. Accordingly, for large thermometer codes, e.g., N=64, at least nine flip-flops are needed which again result in larger silicon areas, consumes high power, and puts excessive loads on clock distribution network requiring more clock buffers.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 4C is a table 430 illustrating the operation of the state diagram 200, according to one embodiment of the disclosure.

FIGS. 5A-B are tables of thermometer and pseudo-thermometer codes generated by the thermometer code generator, according to one embodiment of the disclosure.

DETAILED DESCRIPTION

Figure 1:
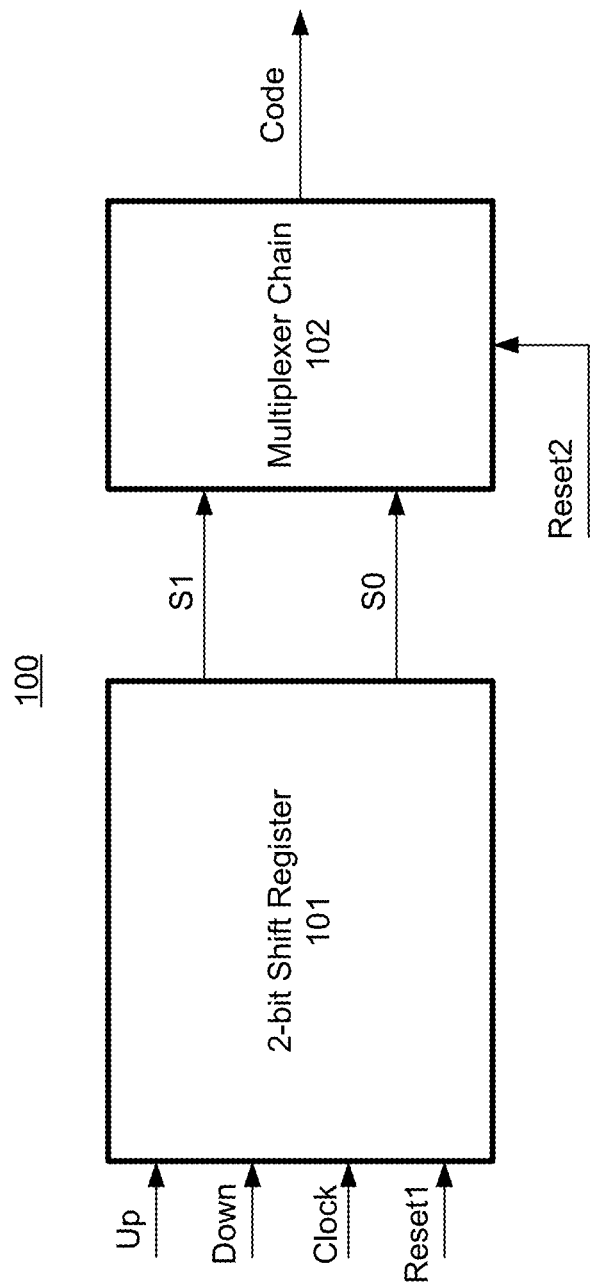
FIG. 1 is a high level architecture of a thermometer code generator, according to one embodiment of the disclosure.

The embodiments describe an apparatus for generating a thermometer code. In one embodiment, the apparatus comprises: a 2-bit bi-directional shift register; and more than two multiplexers operable to form storage units and coupled together in a chain to generate the thermometer code, the more than two multiplexers controlled by outputs of the 2-bit bi-directional shift register.

The more than two multiplexers are also referred to as "N-multiplexers," where 'N' is the width of the thermometer code. For example, N=64. In one embodiment, the N-multiplexers are N 2-input multiplexers controllable by a select signal. In one embodiment, the select signal is generated by the 2-bit bi-directional shift register. In one embodiment, an additional two-input logic gate is coupled to each multiplexer of the N 2-bit multiplexers to force a "reset" state or a pre-determined state for the thermometer code. In one embodiment, 'N' is odd. In one embodiment, 'N' is even. In one embodiment, 'N' is unlimited width for a thermometer code. In one embodiment, 'N' is a multiple of four for generating pseudo-thermometer code.

There are many technical effects of the embodiments. For example, the embodiments can generate thermometer and pseudo-thermometer codes using at most two sequential units which are part of the 2-bit shift register. The N-multiplexers are operable to form storage units to maintain states of the thermometer/pseudo-thermometer codes, according to the embodiments. Since multiplexers are simple logic units compared to sequential logic units (e.g., flip-flops), the embodiments consume less power and area compared to traditional thermometer/pseudo-thermometer code generators.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal, or data/clock signal. The meaning of "a", "an", and the include plural references. The meaning of in includes in and "on."

The term "scaling" generally refers to converting a design (schematic and layout) from one process technology to another process technology. The term "scaling" generally also refers to downsizing layout and devices within the same technology node. The terms "substantially," "close," "approximately," "near," and "about," etc., generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is a high level architecture of a thermometer code generator 100, according to one embodiment of the disclosure. In one embodiment, thermometer code generator 100 comprises a 2-bit shift register 101 and a multiplexer chain 102.

In one embodiment, 2-bit shift register 101 is a bi-directional shift register. In one embodiment, 2-bit shift register 101 receives signals Up, Down, Clock, and Reset1, and generates outputs S1 and S0. In one embodiment, outputs S1 and S0 are select signals to control the selection of input signals of the multiplexers in multiplexer chain 102. In one embodiment, when Up signal is asserted (i.e., transitions from logical zero to logical one) a logical one is feed from least significant bit (LSB) to most significant bit (MSB) of the code (output of multiplexer chain 102).

In one embodiment, when Down signal is asserted (i.e., transitions from logical zero to logical one), a logical zero is feed from MSB towards LSB of the code (output of multiplexer chain 102). In one embodiment, when Up and Down signals are logically zero (i.e., no new Up or Down instruction), then multiplexer chain 102 causes the code to maintain its previous value.

While the embodiments are described with reference to assertions of the Up and Down signals to cause S1 and S0 signals to behave as discussed above, the same behavior of S1 and S0 signals can also be achieved by the de-assertion of Up and Down signals i.e., logic of thermometer code generator 100 can be modified so that de-assertion of Up and Down signals generates functionally equivalent behavior of thermometer code generator 100.

In one embodiment, Clock signal is used as input to at least two sequential units of 2-bit shift register 101, making 2-bit shift register 101 a synchronous 2-bit shift register. In one embodiment, Reset1 signal is received by 2-bit shift register 101 which causes the outputs S1 and S0 to be reset to a predetermined state when Reset1 signal is asserted. In one embodiment, Reset2 signal is received by multiplexer chain 102 to reset or preset the code to a predetermined state. In one embodiment, Reset1 and Reset2 signals are the same signals.

Figure 2:
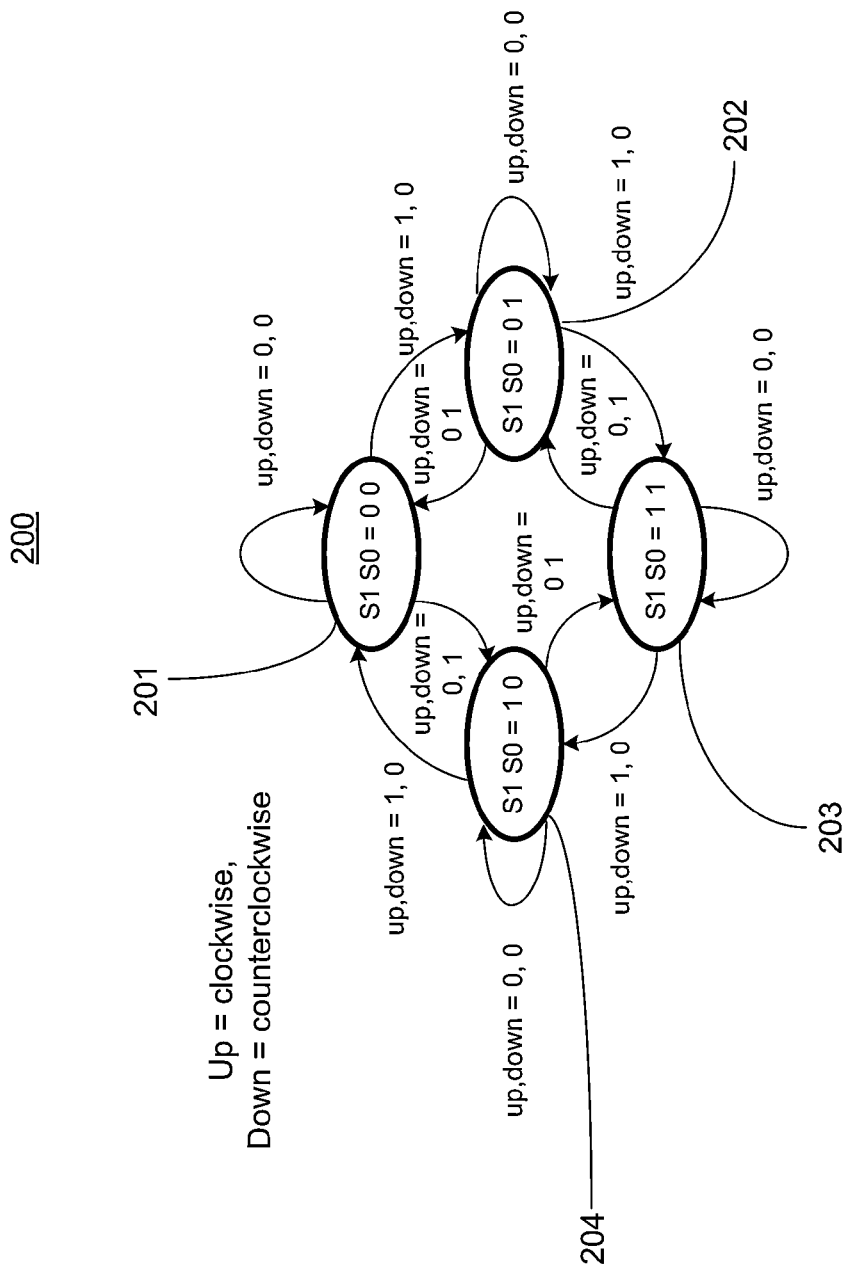
FIG. 2 is a state diagram of a 2-bit shift register for generating thermometer code, according to one embodiment of the disclosure.

FIG. 2 is a state diagram 200 of a 2-bit shift register (e.g., 101) for generating thermometer code, according to one embodiment of the disclosure. It is pointed out that those elements of FIG. 2 having the same reference numbers (or names) as the elements of any other figure can operate or function in any manner similar to that described, but are not limited to such. FIG. 2 is described with reference to FIG. 1.

In one embodiment, 2-bit shift register 101 uses four states—201, 202, 203, and 204—which are implemented using two sequential units. In one embodiment, state 201 is encoded as "00," state 202 is encoded as "01," state 203 is encoded as "11" and state 204 is encoded as "10." The two bits for each state indicate the values of S1 and S0, where S0 is the LSB and S1 is the MSB. For example, state "01" indicates that S1=0 and S0=1. In other embodiments, other encoding schemes may be used. So as not to obscure the embodiments, state transitions caused by Clock and Reset1 signals are not shown.

In one embodiment, clockwise direction from one state to another indicates an Up function i.e., a logical one is feed from LSB towards MSB of the code (output of multiplexer chain 102). In one embodiment, counter-clockwise direction from one state to another indicates a Down function i.e., a logical zero is feed from MSB towards LSB of the code (output of multiplexer chain 102).

In one embodiment, when S1 and S0 are logical zeros then the code value is maintained which is indicated by a self loop to the state. For example, when Up and Down signals are both logical zeros, at the next clock cycle, 2-bit shift register 101 remains in its previous state i.e., in hold state. When Up signal is logical one and Down signal is logical zero then the state of 2-bit shift register 101 moves clockwise in the state diagram 200.

For example, if the current state is 201 (i.e., S1=0, S0=0) then at the next clock cycle the current state becomes 202 (i.e., S1=0, S0=1). Likewise, if the current state is 204 (i.e., S1=1, S0=0) then at the next clock cycle the current state becomes 201 (i.e., S1=0, S0=0). When Up signal is logical zero and Down signal is logical one then the state of 2-bit shift register 101 moves counter-clockwise in the state diagram 200. For example, if the current state is 201 (i.e., S1=0, S0=0) then at the next clock cycle the current state becomes 204 (i.e., S1=1, S0=0). Likewise, if the current state is 204 (i.e., S1=1, S0=0) then at the next clock cycle the current state becomes 203 (i.e., S1=1, S0=1).

Figure 3:
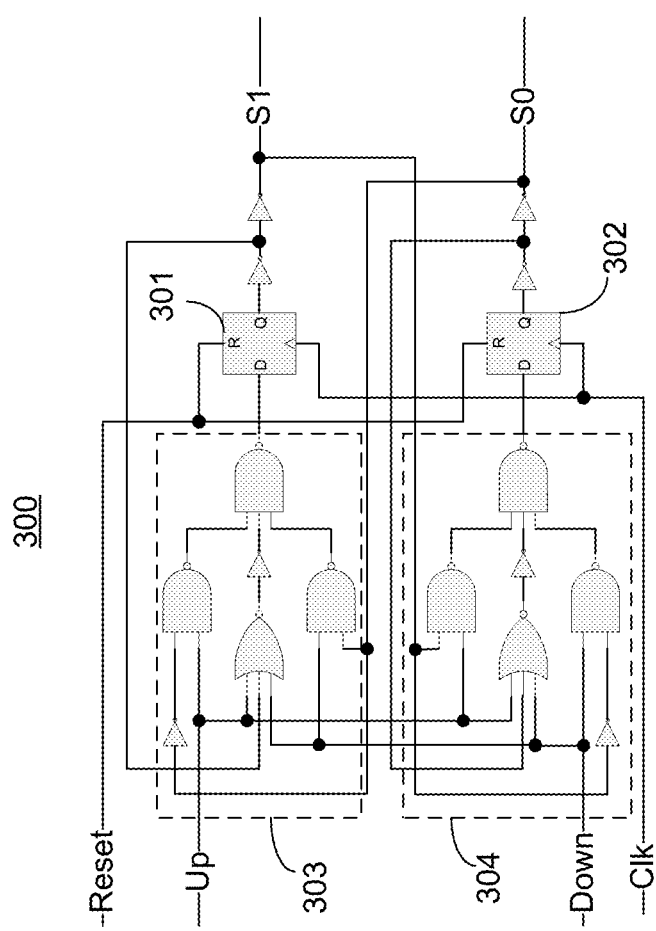
FIG. 3 is a circuit implementation of the state diagram, according to one embodiment of the disclosure.

FIG. 3 is a circuit implementation 300 of the state diagram 200, according to one embodiment of the disclosure. It is pointed out that those elements of FIG. 3 having the same reference numbers (or names) as the elements of any other figure can operate or function in any manner similar to that described, but are not limited to such. FIG. 3 is described with reference to FIG. 2 and FIG. 1.

In one embodiment, circuit implementation 300 (also called 2-bit shift register) comprises at most two sequential units 301 and 302, and combinational logic 303 and 304. In one embodiment, logic units 303 and 304 implement multiplexors to control the inputs to the sequential units 301 and 302 to implement the state diagram 200. In one embodiment, the multiplexors are 3-input multiplexors. In one embodiment, the multiplexors are controlled by the Up and Down signals (or commands). For example, when Up and Down signals are logical low, the multiplexors provide a re-circulation path for sequential units 301 and 302 to hold their state. In the embodiments discussed, any length of thermometer code can be generated using circuit implementation 300. Such an implementation allows for low power generation of thermometer codes which is not possible using traditional thermometer code generators. For example, for a 64 bit thermometer code, at most two sequential units 301 and 302 are used in these embodiments. Conversely, a traditional thermometer code generator will use 64 sequential units.

Figure 4A:
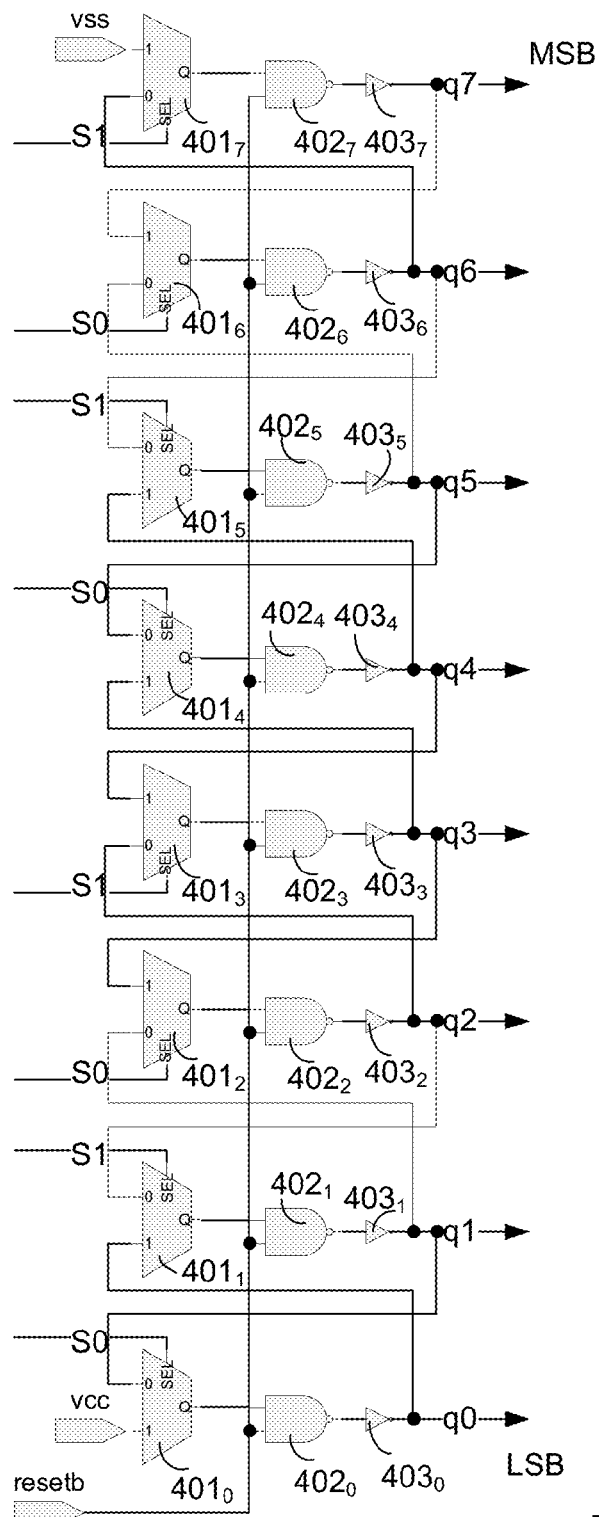
FIG. 4A is a multiplexer chain operable to form storage units and to generate thermometer code, according to one embodiment of the disclosure.

FIG. 4A is a multiplexer chain 400 (e.g., 102) operable to form storage units and to generate thermometer code, according to one embodiment of the disclosure. It is pointed out that those elements of FIG. 4A having the same reference numbers (or names) as the elements of any other figure can operate or function in any manner similar to that described, but are not limited to such. FIG. 4A is described with reference to FIGS. 1-3. In this exemplary embodiment, multiplexer chain 400 comprises eight multiplexers i.e., N=8.

In one embodiment, multiplexer chain 400 comprises a plurality of multiplexers $401_0$-$401_7$, plurality of logic units shown as logic units $402_0$-$402_7$ and $403_0$-$403_7$. Multiplexer chain 400 provides the capability to propagate code as well as provide state storage by dynamically changing state location among the multiplexors. In one embodiment, each of plurality of logic units ($402_0$-$402_7$ and $403_0$-$403_7$) implements a logical AND operation. For example, logic units $402_0$-$402_7$ (NAND gates) and $403_0$-$403_7$ (inverters) collectively provide an AND operation. In this embodiment, output of the plurality of logic units is the thermometer code—q0-q7, where q0 is the LSB while q7 is the MSB of the thermometer code.

In one embodiment, the purpose of the AND operation is to provide a predetermined thermometer code when "resetb" signal is logical zero, where "resetb" is an inverse of "reset" signal which is not shown. The reset function which is used to force a predetermined value for the thermometer code can also be accomplished by other logic units. For example, in one embodiment NOR gates may be used instead of NAND gates $402_{0-7}$. In one embodiment, the reset function may be removed. Accordingly, logic units $402_0$-$402_7$ (NAND gates) and $403_0$-$403_7$ (inverters) can be eliminated. In such an embodiment, outputs of each multiplexer directly provides the thermometer code, and the multiplexer are directly cross-coupled.

In one embodiment, plurality of multiplexers $401_0$-$401_7$ are two input multiplexers with a one bit control signal. In one embodiment, the control signal is either S0 or S1 generated by 2-bit shift register (e.g., 300). In one embodiment, multiplexers $401_0$-$401_7$ are implemented using pass-gates. In one embodiment, multiplexers $401_0$-$401_7$ are implemented using tri-gate inverters. In other embodiments, multiplexers $401_0$-$401_7$ are implemented using other logic units.

In one embodiment, first multiplexer $401_0$ receives logical one (e.g., Vcc power supply) and output q1 as its inputs. In this embodiment, last multiplexer (i.e., eighth multiplexer) $401_7$ receives logical zero (e.g., Vss or ground) and output q6 as its inputs. In one embodiment, multiplexers $401_0$ to $401_7$ are cross-coupled to one another and are operable to function as storage units (e.g., latches).

In one embodiment, the output of one multiplexor is coupled to one of the inputs of the preceding and succeeding multiplexors, etc. Such an embodiment provides a bi-directional shift path for the code to progress through the string of multiplexors $401_0$-$401_7$. In this embodiment, the multiplexor data and select inputs are arranged such that latches are configured by 2-bit shift register 300 with a pattern of a latch comprising of two adjacent multiplexors and two multiplexors between the latches. In this embodiment, location of latches changes position dynamically in the string of multiplexors $401_0$-$401_7$ based on the state of the two bits (S0 and S1) of the 2-bit bi-directional shift register 300.

For example, multiplexers $401_1$ and $401_2$ are cross-coupled in that multiplexer $401_1$ receives input q2 (according to output generated by $401_2$) while multiplexer $401_2$ receives input q1 (according to output generated by multiplexer $401_1$). In one embodiment, the cross-coupling of outputs (e.g., q1 and q2) allow multiplexers $401_1$ and $401_2$ to form storage unit by appropriate selections of control signals (also called select signals) S1 and S0. In one embodiment, when S1 and S0 signals are logical zero, thermometer code (q1-q7) does not change (i.e., maintains its previous value). For example, when S1 and S0 signals are logical zero, multiplexer $401_1$ selects q2 as its output while multiplexer $401_2$ selects q1 as its output to form a cross-coupled storage unit. In another example, when S1 and S0 signals are logical zero, multiplexer $401_5$ selects q6 as its output while multiplexer $401_6$ selects q5 as its output to form a cross-coupled storage unit.

Figure 4B:
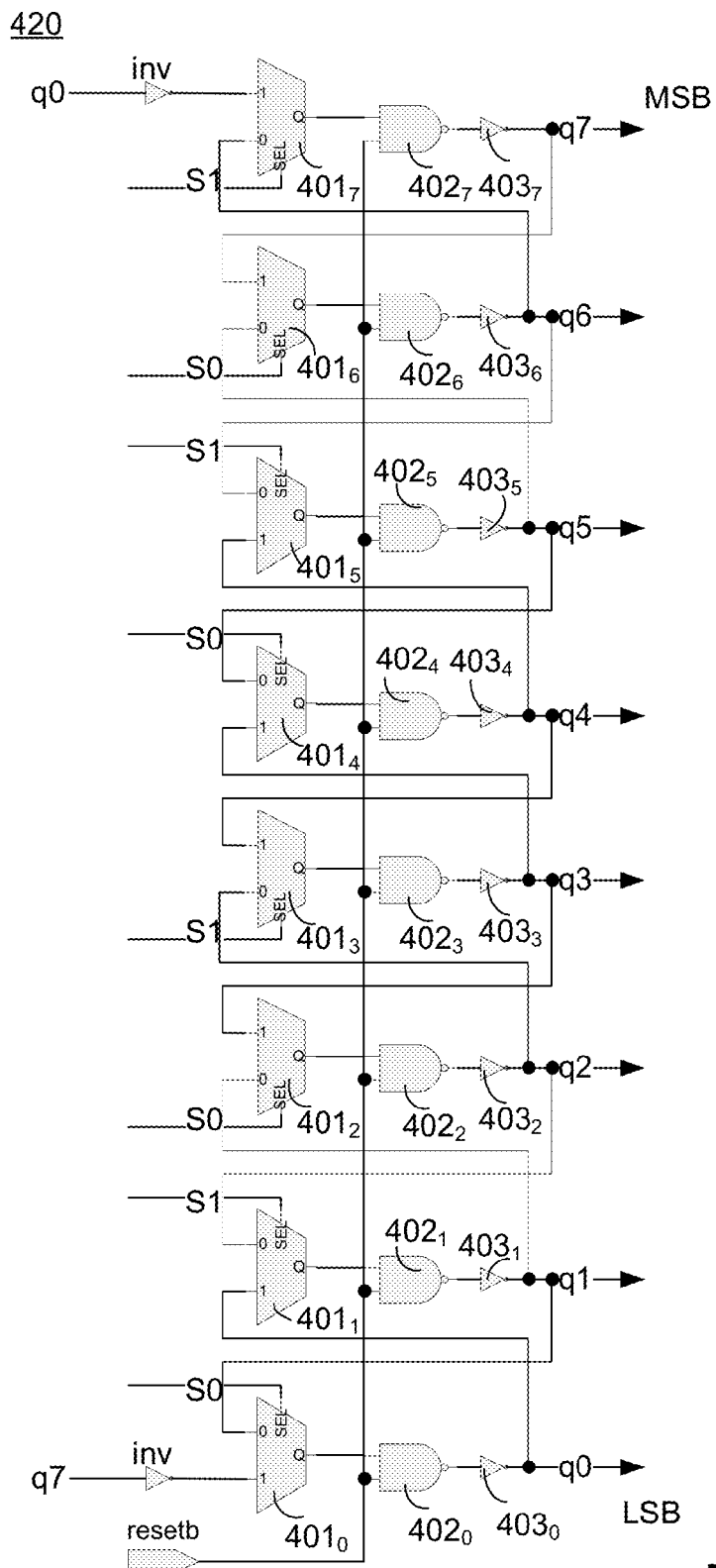
FIG. 4B is a multiplexer chain operable to form storage units and to generate pseudo-thermometer code, according to one embodiment of the disclosure.

FIG. 4B is a multiplexer chain 420 (e.g., 102) operable to form storage units and to generate pseudo-thermometer code, according to one embodiment of the disclosure. It is pointed out that those elements of FIG. 4B having the same reference numbers (or names) as the elements of any other figure can operate or function in any manner similar to that described, but are not limited to such.

The embodiment of FIG. 4B is similar to the embodiment of FIG. 4A except for the following changes. In one embodiment, multiplexer $401_0$ (first multiplexer that generates q0) receives an inverted version of q7 instead of Vcc at its input node. In one embodiment, multiplexer $401_7$ (last multiplexer that generates q7) receives an inverted version of q0 instead of Vss at its input node.

Figure 4C:
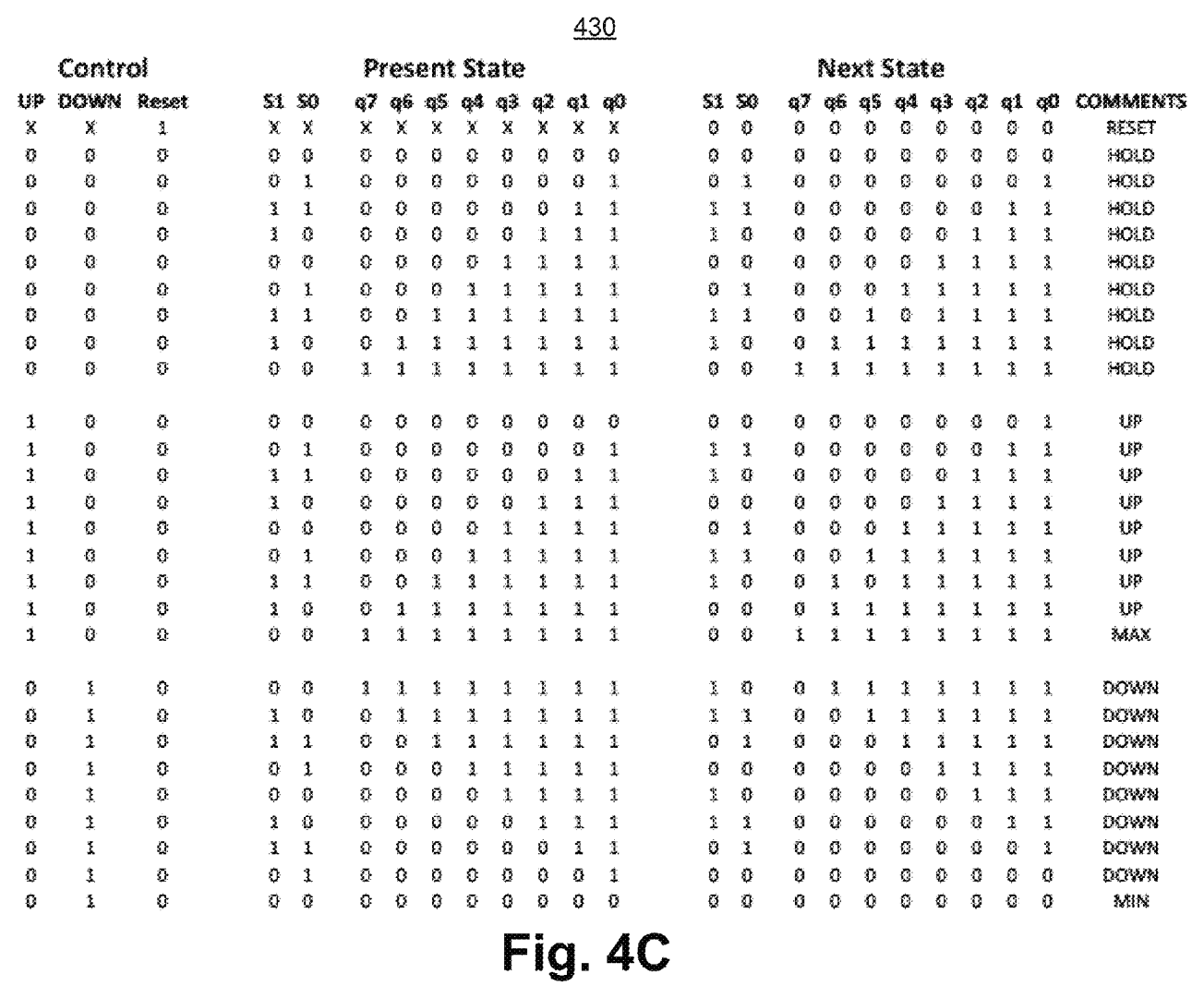

FIG. 4C is a table 430 illustrating the operation of state diagram 200 in view of the multiplexer chain 400 (same as 102) using 2-bit shift register 101, according to one embodiment of the disclosure. It is pointed out that those elements of FIG. 4C having the same reference numbers (or names) as the elements of any other figure can operate or function in any manner similar to that described, but are not limited to such.

Table 430 shows the states of q0-q7 for different input commands—Up, Down, and Reset—which generate S1 and S0 select signals. Table 430 illustrates the present state and the next state (see state diagram 200 of FIG. 2) of q0-q7 for various logical levels of select signals S1 and S0.

FIGS. 5A-B are tables of thermometer and pseudo-thermometer codes generated by the thermometer code generator, according to one embodiment of the disclosure. FIG. 5A illustrates a table 500 with 8-bit thermometer code generated by the thermometer code generator 400. FIG. 5B illustrates a table 520 with 8-bit pseudo-thermometer code generated by the thermometer code generator 420.

FIGS. 6A-D are operational states of the multiplexer chain for various outputs of the 2-bit shift register, according to the embodiments. It is pointed out that those elements of FIGS. 6A-D having the same reference numbers (or names) as the elements of any other figure can operate or function in any manner similar to that described, but are not limited to such. The operational states indicate the rotation of multiplexer based latches to generate the thermometer code. The embodiments of FIGS. 6A-D are described with reference to FIGS. 1-5. The operational states illustrates that shifting of the state of the control bits of the multiplexers $401_{0-7}$ creates state storage and propagation of the thermometer code with respect to the Up/Down shift commands (that are used to generate S1 and S0 select signals).

Figure 6A:
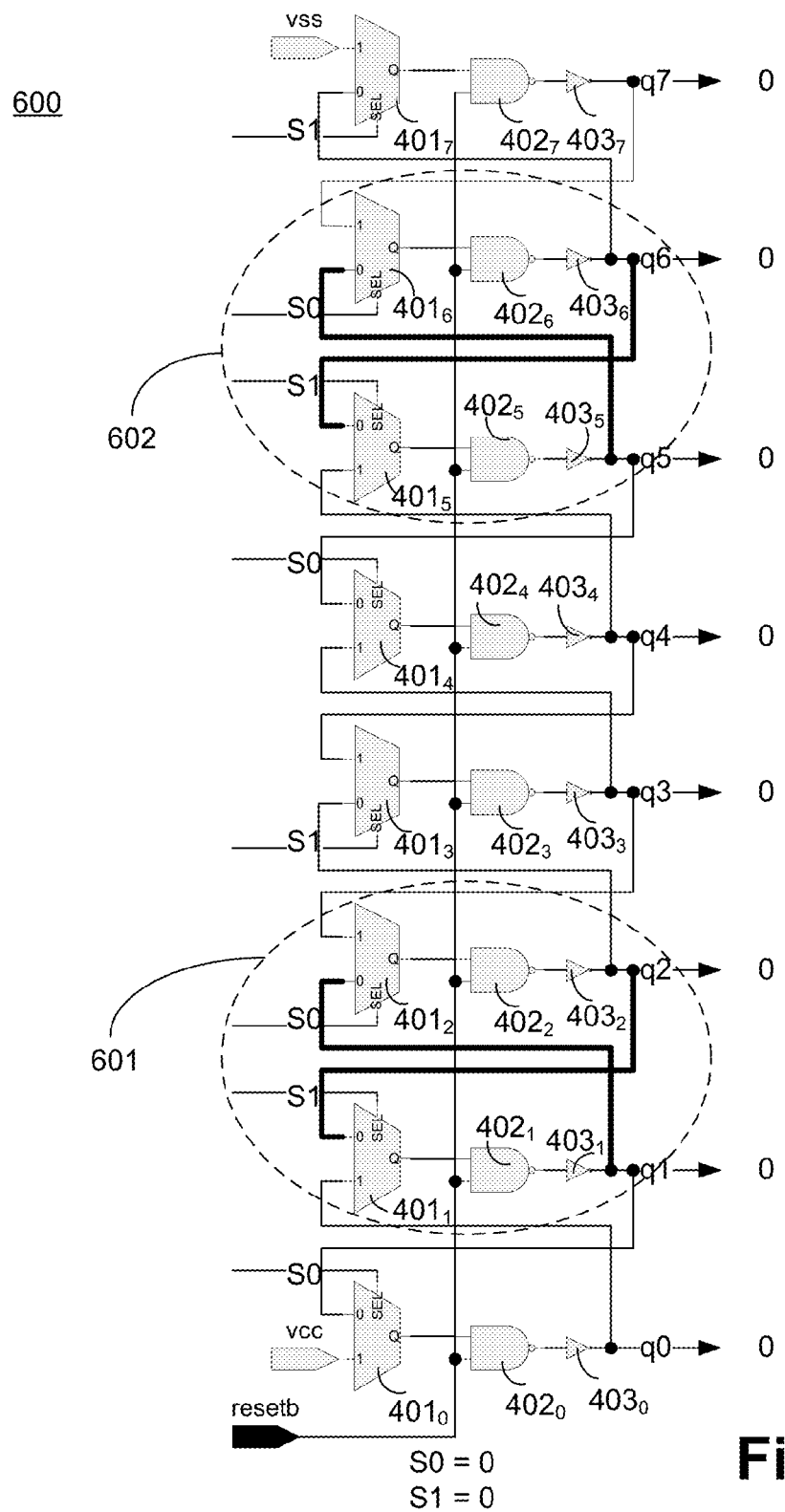
FIGS. 6A-D are operational states of the multiplexer chain for various outputs of the 2-bit shift register, according to the embodiments of the disclosure.

FIG. 6A is a snapshot 600 of the states of multiplexer chain (e.g., 400) when S0 and S1 are logically zero. When signals S0 and S1 are logical zero, the thermometer code state is maintained (or held). In one embodiment, multiplexer chain 400 maintains the thermometer code by forming storage (or latch) units e.g., 601 and 602. In this example, by forming storage units 601 and 602, states (q0, q3, q4, and q7) generated by adjacent multiplexers (e.g., $401_0$, $401_3$, $401_4$, and $401_7$) are also preserved. For example, latch 601 holds the states of q1 and q2. In this example, output q2 causes output q3 to be held and output q1 causes output q0 to be held. Likewise, latch 602 holds the states of q5 and q6. In this example, output q6 causes output q7 to be held and output q5 causes output q4 to be held. In such an embodiment, multiplexer chain 400 maintains the thermometer code (q7-q0) by creating multiplexer based latches when S1 and S0 are both logical zeros.

Figure 6B:
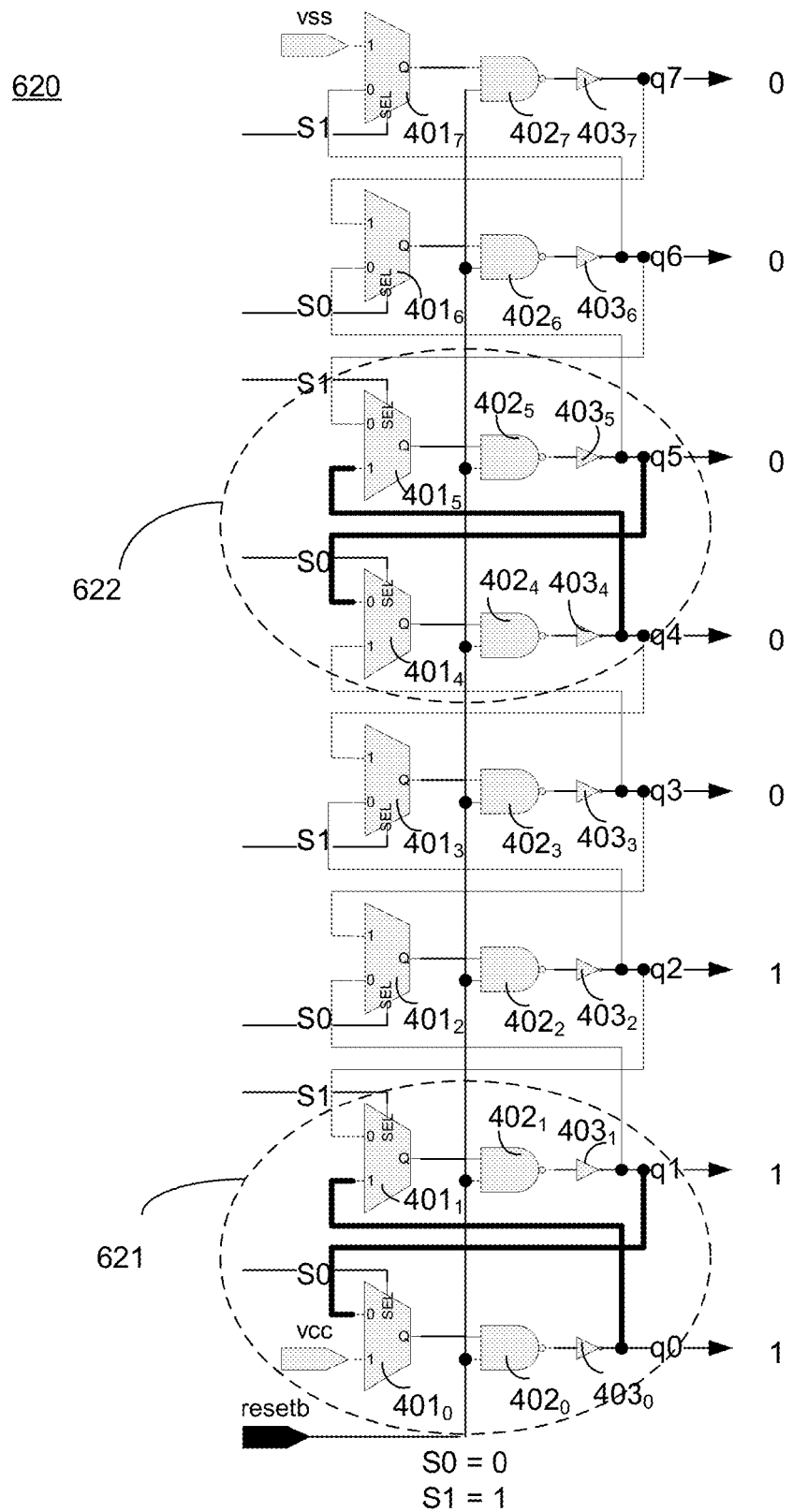

FIG. 6B is a snapshot 620 of the states of multiplexer chain (e.g., 400) when S0 is logical zero and S1 is logical one. In this example, the thermometer code (q7-q0) is 00000111 and the 1/0 boundary is between code bits q3 and q2. In this embodiment, the state of S1=1 and S0=0 creates the multiplexer latch pair comprising of multiplexers that generate code bits q4 and q5, and q0 and q1.

Latch pair 621 holds a '1' state for outputs q1 and q0. Latch pair 621 also drives bit q2 through its multiplexer $401_1$. This scenario happens throughout the multiplexer string $401_{0-7}$ and changes with change in S0 and S1 signals, which change in relation to Up/Down commands (and clock and reset signals) discussed with reference to FIGS. 1-3. An "Up" command would change S0=0 and S1=0 to S0=0 and S1=1 and the code (q7-q0) changes from 00000111 to 00001111 in one clock cycle. If "Up" remains at logical 1 then the multiplexer chain 400 continues to feed a '1' (or a '0' depending on the logic implementation) on every clock cycle.

Figure 6C:
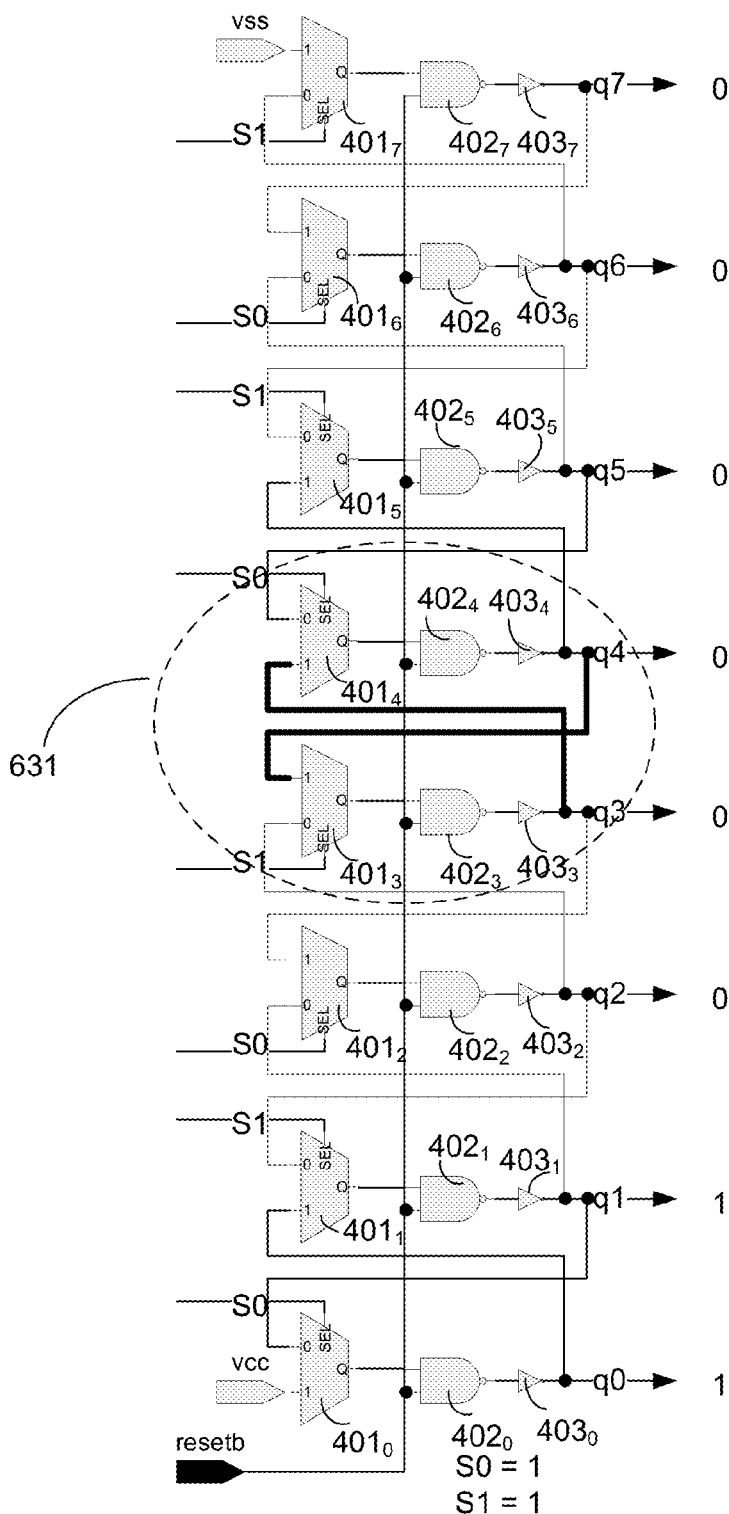

FIG. 6C is a snapshot 630 of the states of multiplexer chain (e.g., 400) when S0 and S1 are logical one. In this embodiment, compared to FIGS. 6A-B, the pair of multiplexers forming the storage units is changed. In this example, storage unit 631 is formed by multiplexers generating outputs code bits q4 and q3. Compared to the operation of FIG. 6B where S0=0 and S1=1, FIG. 6C illustrates the situation when a Down command is received by the 2-bit shift register (e.g., 300). A "Down" command would change S0=0 and S1=1 to S0=1 and S1=1 and the code (q7 to q0) changes from 00000111 (of FIG. 6B) to 00000011 in one clock cycle.

Figure 6D:
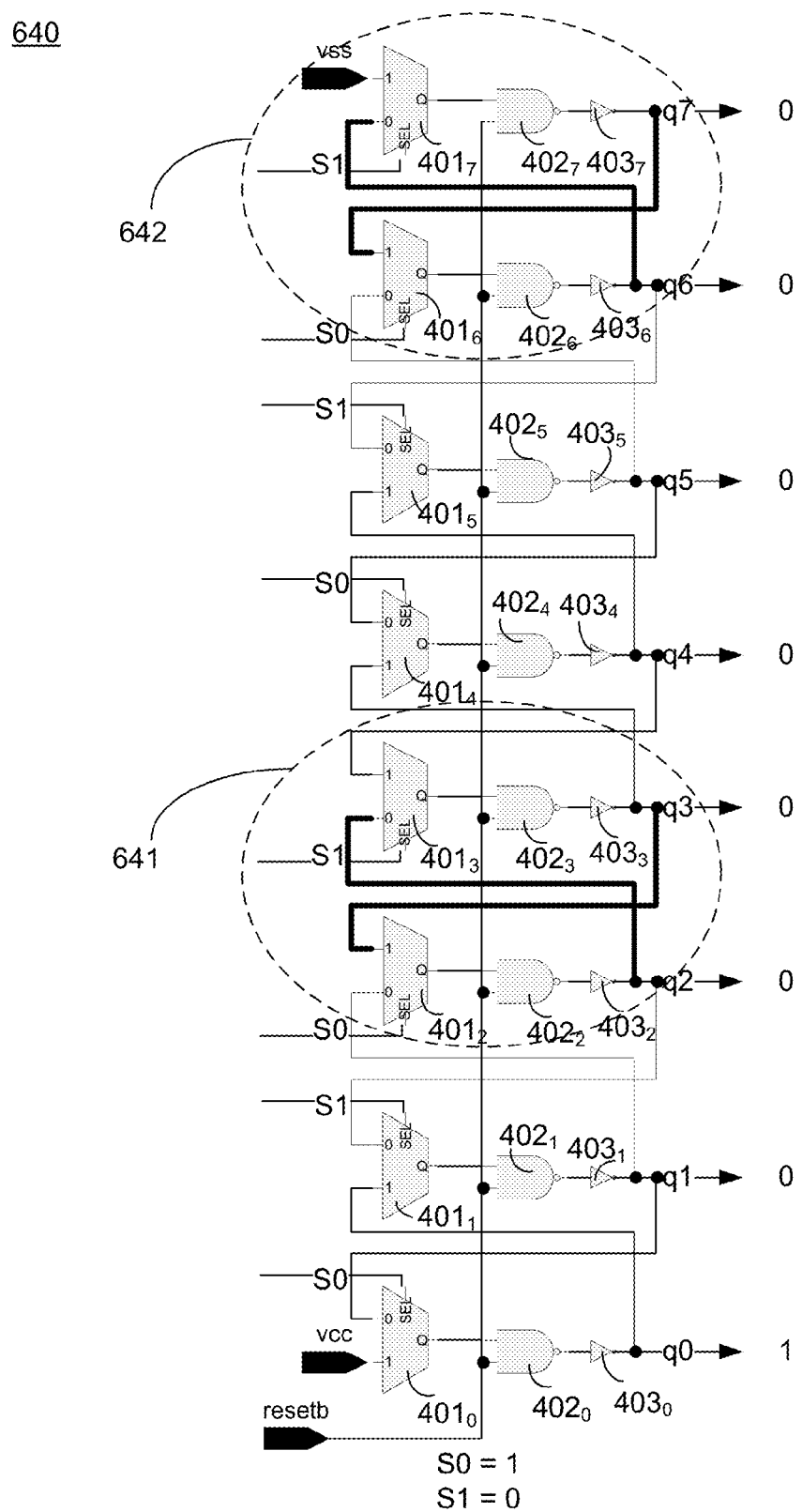

FIG. 6D is a snapshot 640 of the states of multiplexer chain (e.g., 400) when S0 is logical one and S1 is logical zero. Since S0 is logical 1 and S1 is logical 0, a down operation is performed. In this embodiment, compared to FIG. 6A, the pair of multiplexers forming the storage units is changed. See, for example, storage unit 641 relative to 601 and storage unit 642 relative to 602. In this embodiment, code bit q0 outputs a 1 while q7-q1 remains zero. A "Down" command would change current states of S0=1 and S1=0 to next states of S0=1 and S1=1 and the code (q7-q0) changes from 00000011 (of FIG. 6C) to 00000001 in one clock cycle.

The embodiments are not limited to 8 bits of thermometer code. The embodiments allow extending the thermometer code length to longer lengths, without adding more sequential units or registers, by extending the chain of multiplexers.

Another technical effect of the embodiments is that there are no critical timing paths to match due to the nature of S0 and S1 signals and the circuit topology of multiplexer chain 400. Signals S0 and S1 toggle one bit at a time to change the multiplexer control bits. Changing the multiplexer control bits (signals S1 and S0) in this manner creates no setup or hold paths for the multiplexer-latch inputs and outputs, as the latches are created when both multiplexer outputs and inputs are at the same value. The embodiments thus provide a glitch-less change in 1 to 0 and 0 to 1 transitions. The embodiments also reduce power over traditional thermometer code generators because bits of S0 and S1 signals change at ¼ the clock rate and each of S0 and S1 bits controls half of the multiplexer select ports.

In one embodiment, at maximum or minimum values of the thermometer code, a logic unit (not shown) detects these states (of maximum or minimum values) and enables the 2-bit shift register 300. For example, the logic unit disables the Up command to 2-bit shift register 300 when multiplexer chain 400 is at maximum state (i.e., when q7-q0 are all logical ones). In one embodiment, the logic unit disables the Down command to 2-bit shift register 300 when multiplexer chain 400 is at minimum state (i.e., when q7-q0 are all logical zeros). In such an embodiment, the logic unit keeps 2-bit shifter register is in sync with the state of multiplexer chain 400. In one embodiment, thermometer code can be started in some arbitrary state by pre-setting the appropriate multiplexers in multiplexer chain 400. For example, multiplexer chain 400 can be preset to the middle of a range: 11110000, and adjusted up and down. For non-multiple-of-four and odd codes, the 2-bit shift register may have to be started in an appropriate state.

Figure 7:
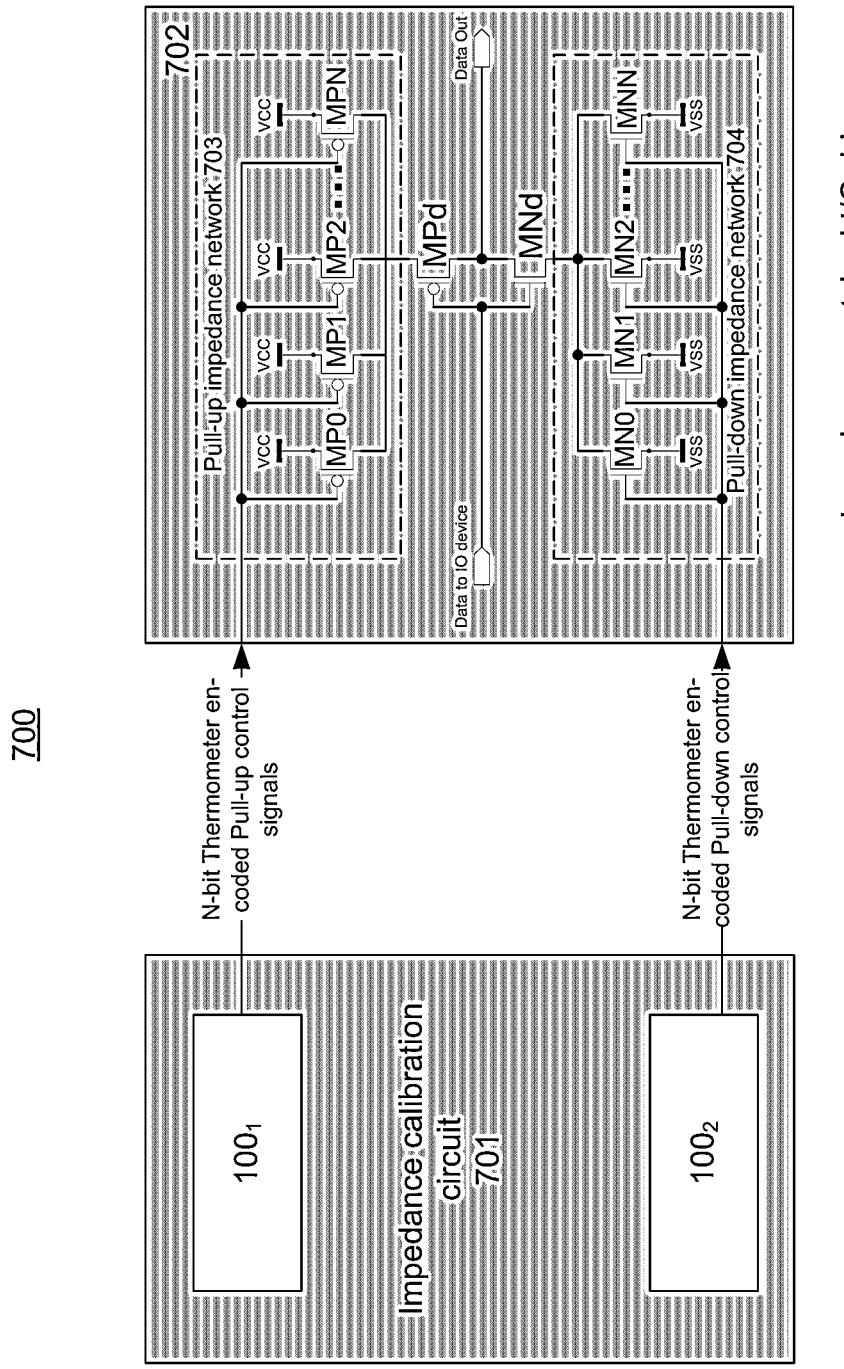
FIG. 7 is a high level input-output architecture with the thermometer code generator, according to one embodiment of the disclosure.

FIG. 7 is an input-output (I/O) high level partial architecture 700 with the thermometer code generator, according to one embodiment of the disclosure. It is pointed out that those elements of FIG. 7 having the same reference numbers (or names) as the elements of any other figure can operate or function in any manner similar to that described, but are not limited to such.

In one embodiment, I/O architecture 700 comprises an impedance calibration circuit 701 and an impedance matched I/O driver 702. In one embodiment, impedance calibration circuit 701 provides N-bit Thermometer encoded Pull-up control signals and N-bit Thermometer encoded Pull-down control signals to the impedance matched I/O driver 702. Impedance calibration circuit 701 controls Pull-up and Pull-down impedance of I/O driver 702. In one embodiment, impedance calibration circuit 701 comprises thermometer code generator $100_1$ to generate N-bit Thermometer encoded Pull-up control signals and thermometer code generator $100_2$ to generate N-bit Thermometer encoded Pull-down control signals.

In one embodiment, impedance matched I/O driver 702 comprises Pull-up impedance network 703, Pull-down impedance network 704, and driver devices MPd and MNd. Driver devices MPd and MNd receive data for transmission and drive them out on node Data Out. Pull-up impedance network 703 comprises a plurality of parallel coupled p-type devices MP0-MPN, where 'N' is an integer greater than 1. In one embodiment, N-bit thermometer encoded Pull-up control signals from impedance calibration circuit 701 are received by Pull-up impedance network 703 such that each control signal is used to control gate terminal of a p-type device in Pull-up impedance network 703.

Pull-down impedance network 703 comprises a plurality of parallel coupled n-type devices MN0-MNN, where 'N' is an integer greater than 1. In one embodiment, N-bit thermometer encoded Pull-down control signals from impedance calibration circuit 701 are received by Pull-down impedance network 704 such that each control signal is used to control gate terminal of a n-type device in Pull-down impedance network 704.

Figure 8:
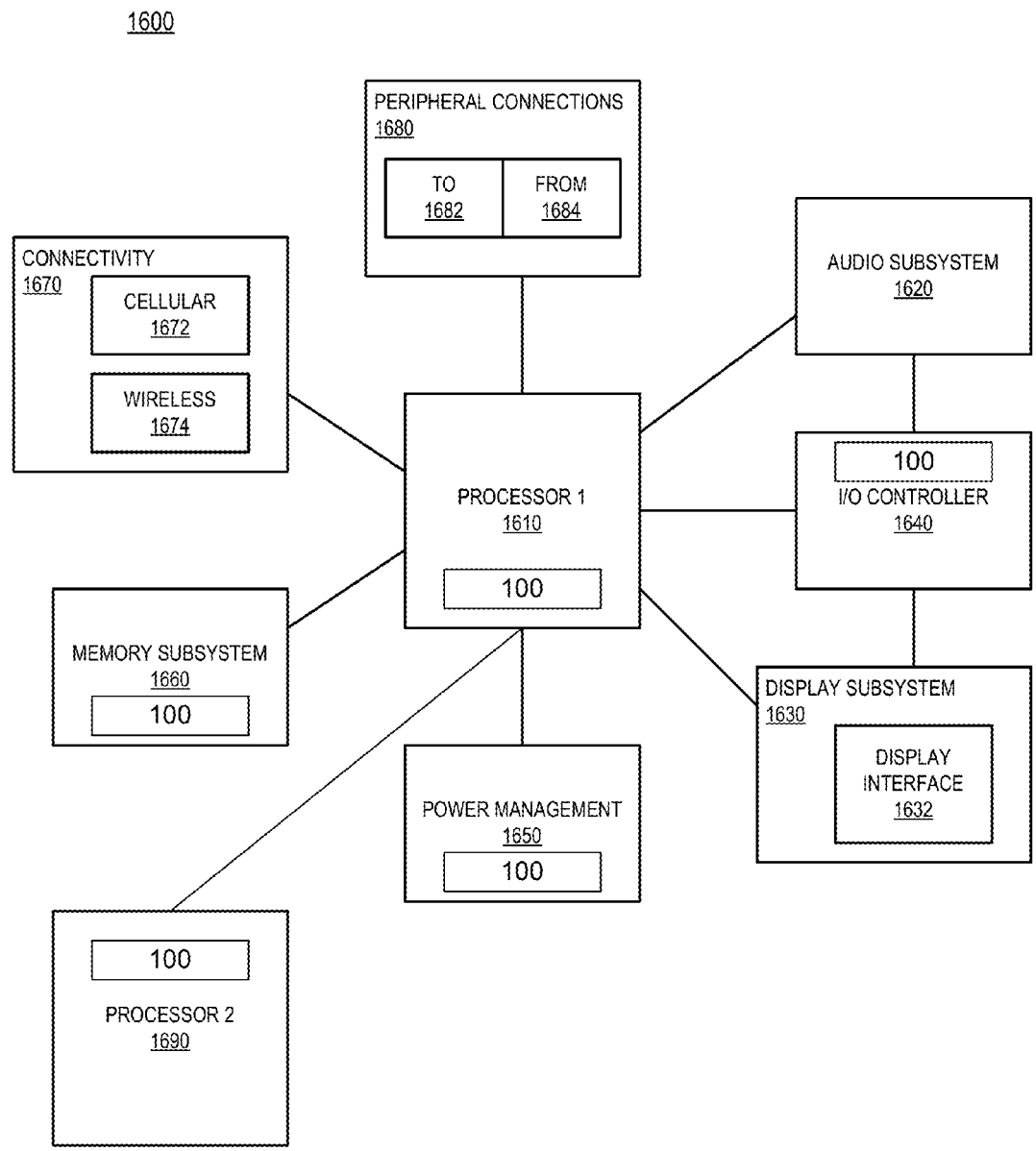
FIG. 8 is a smart device or a computer system or a SOC (system on chip) with an apparatus for generating thermometer codes, according to one embodiment of the disclosure.

FIG. 8 is a smart device or a computer system or a SOC (system on chip) with an apparatus for generating thermometer codes, according to one embodiment of the disclosure. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with a thermometer or pseudo-thermometer code generator of FIG. 1, and a second processor 1690 with a thermometer or pseudo-thermometer code generator of FIG. 1, according to the embodiments discussed. Other blocks of the computing device 1600 with I/O drivers may also include a thermometer or pseudo-thermometer code generator of FIG. 1. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device 1600. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications, and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment apparatus is provided for generating a thermometer code, the apparatus comprises: a 2-bit bi-directional shift register; and more than two multiplexers operable to form storage units and coupled together in a chain to generate the thermometer code, the more than two multiplexers controlled by outputs of the 2-bit bi-directional shift register. In one embodiment, the apparatus comprises logic to reset the thermometer code to a predetermined code. In one embodiment, the logic to perform an AND operation of an output of a multiplexer, from among the more than two multiplexers, and a reset signal. In one embodiment, the output of the logic is coupled to an input node of a multiplexer from among the more than two multiplexers. In one embodiment, the outputs of the 2-bit bi-directional shift register are coupled to selection ports of the more than two multiplexers.

In one embodiment, the output of a multiplexer from among the more than two multiplexers is coupled to an input node of another multiplexer from among the more than two multiplexers. In one embodiment, the 2-bit bi-directional shift register is operable to generate first and second signals to identify a pair of multiplexers, from among the more than two multiplexers, that are to operate as storage units.

In one embodiment, an apparatus comprises: a 2-bit bi-directional shift register to generate first and second select signals according to first and second input signals; and a plurality of multiplexers controllable by the first and second select signals, the plurality of multiplexers to generate a pseudo-thermometer code according to the first and second select signals. In one embodiment, the plurality of multiplexers is operable to form storage units. In one embodiment, the apparatus comprises logic to reset the thermometer code to a predetermined code despite the logic levels of the first and second select signals.

In another example, a system comprises a memory; and a processor, coupled to a memory, the processor having a input-output (I/O) driver to communicate with another processor, the I/O driver having an impedance controllable by a plurality of transistors, wherein the plurality of transistors to receive a thermometer code generated by a logic comprising: a 2-bit bi-directional shift register; and more than two multiplexers operable to form storage units and coupled together in a chain to generate the thermometer code, the more than two multiplexers controlled by outputs of the 2-bit bi-directional shift register.

In one embodiment, the system further comprises a wireless interface to allow the processor to communicate with another device. In one embodiment, the system further comprises a display unit. In one embodiment, the system further comprises logic to reset the thermometer code to a predetermined code. In one embodiment, the logic to perform an AND operation of an output of a multiplexer, from among the more than two multiplexers, and a reset signal. In one embodiment, output of the logic is coupled to an input node of a multiplexer from among the more than two multiplexers.

In one embodiment, outputs of the 2-bit bi-directional shift register are coupled to selection ports of the more than two multiplexers. In one embodiment, output of a multiplexer from among the more than two multiplexers is coupled to an input node of another multiplexer from among the more than two multiplexers. In one embodiment, the 2-bit bi-directional shift register is operable to generate first and second signals to identify a pair of multiplexers, from among the more than two multiplexers, that are to operate as storage units. In one embodiment, the more than two multiplexers are cross-coupled with one another.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus for generating a thermometer code, the apparatus comprising:
   a 2-bit bi-directional shift register to generate first and second outputs; and
   N multiplexers comprising a first multiplexer, a second multiplexer and a third multiplexer, each of the N multiplexers having a first input and a second input, the N multiplexers having cross-coupled outputs operable to form storage units, the first multiplexer having a first output coupled to the first input of the second multiplexer and to the first input of the third multiplexer, the second multiplexer having a second output coupled to the first input of the first multiplexer, and the third multiplexer having a third output coupled to the second input of the first multiplexer to form a multiplexer chain of the N multiplexers together for use in generating the thermometer code, wherein the N is an integer greater than two that represents a width of the thermometer code, and wherein one of the first and second outputs of the 2-bit bi-directional shift register is provided to a selection of an input of the first and second inputs of said each of the N multiplexers to select one of the first and second inputs of the N multiplexers in the multiplexer chain; and
   wherein the 2-bit bi-directional shift register is operable to generate first and second signals to identify a pair of multiplexers, from among the N multiplexers, that are to operate as the storage units.

2. The apparatus of claim 1 further comprises a logic to reset the thermometer code to a predetermined code.

3. The apparatus of claim 2, wherein the logic is to perform an AND operation of an output of the first, second and third outputs of a multiplexer, from among the N multiplexers, and a reset signal.

4. The apparatus of claim 2, wherein an output of the logic is coupled to an input node of a multiplexer from among the N multiplexers.

5. The apparatus of claim 1, wherein the first and second outputs of the 2-bit bi-directional shift register are coupled to selection ports of the N multiplexers.

6. The apparatus of claim 1, wherein an output of the first, second and third outputs of a multiplexer from among the N multiplexers is coupled to an input node of another multiplexer from among the N multiplexers.

7. An apparatus comprising:
   a 2-bit bi-directional shift register to generate first and second select signals according to first and second input signals; and
   N multiplexers comprising a first multiplexer, a second multiplexer and a third multiplexer coupled to the 2-bit directional shift register, each of the N multiplexers having a first input and a second input, the N multiplexers having cross-coupled outputs operable to form storage units, wherein a first output of the first multiplexer is coupled to the first input of the second multiplexer and to the first input of the third multiplexer, the second multiplexer having a second output coupled to the first input of the first multiplexer, and the third multiplexer having a third output coupled to the second input of the first multiplexer to form a multiplexer chain the N multiplexers together, the N multiplexers to generate a pseudo-thermometer code according to the first and second select signals, wherein the N is an integer greater than two that represents a width of the pseudo-thermometer code, and wherein one of the first and second select signals of the 2-bit bi-directional shift register is provided to a selection of an input of the first and second inputs of said each of the N multiplexers to select one of the first and the second inputs of the N multiplexers in the multiplexer chain; and
   wherein the 2-bit bi-directional shift register is operable to generate third and fourth signals to identify a pair of multiplexers, from among the N multiplexers, that are to operate as the storage units.

8. The apparatus of claim 7 further comprises a logic to reset the pseudo-thermometer code to a predetermined code despite logic levels of the first and second select signals.

9. A system comprising:
   a memory; and
   a processor, coupled to the memory, the processor having a input-output (I/O) driver to communicate with another processor, the I/O driver having an impedance controllable by a plurality of transistors, wherein the plurality of transistors to receive a thermometer code generated by a logic comprising:
   a 2-bit bi-directional shift register to generate first and second outputs; and
   N multiplexers comprising a first multiplexer, a second multiplexer and a third multiplexer, each of the N multiplexers having a first input and a second input, the N multiplexers having cross-coupled outputs operable to form storage units and coupled together, the first multiplexer having a first output coupled to the first input of the second multiplexer and to the first input of the third multiplexer, the second multiplexer having a second output coupled to the first input of the first multiplexer, and the third multiplexer having a third output coupled to the second input of the first multiplexer to form a multiplexer chain for use in generating the thermometer code, wherein the N is an integer greater than two that represents a width of the thermometer code, and wherein one of the first and second outputs of the 2-bit bidirectional shift register is provided to a selection of an input of the first and second inputs of said each of the N multiplexers to select one of the first and second inputs of the N multiplexers in the multiplexer chain; and wherein the 2-bit bi-directional shift register is operable to generate third and fourth signals to identify a pair of multiplexers, from among the N multiplexers, that are to operate as the storage units.

10. The system of claim 9 further comprises a wireless interface to allow the processor to communicate with another device.

11. The system of claim 9 further comprises a display unit.

12. The system of claim 9, further comprises a second logic to reset the thermometer code to a predetermined code.

13. The system of claim 12, wherein the second logic is to perform an AND operation of an output of a multiplexer, from among the N multiplexers, and a reset signal.

14. The system of claim 12, wherein an output of the second logic is coupled to an input node of a multiplexer from among the N multiplexers.

15. The system of claim 9, wherein the first and second outputs of the 2-bit bi-directional shift register are coupled to selection ports of the N multiplexers.

16. The system of claim 9, wherein an output of the first, second and third outputs of a multiplexer from among the N multiplexers is coupled to an input node of another multiplexer from among the N multiplexers.

17. The system of claim 9, wherein the N multiplexers are cross-coupled with one another.

* * * * *